US006969879B2

(12) United States Patent
Raynor

(10) Patent No.: US 6,969,879 B2
(45) Date of Patent: Nov. 29, 2005

(54) SOLID STATE IMAGE SENSOR

(75) Inventor: Jeff Raynor, Edinburgh (GB)

(73) Assignee: STMicroelectronics Ltd., Buckinghamshire (GB)

( * ) Notice: Subject to any disclaimer, the term of this patent is extended or adjusted under 35 U.S.C. 154(b) by 0 days.

(21) Appl. No.: 10/645,320

(22) Filed: Aug. 21, 2003

(65) Prior Publication Data

US 2005/0072978 A1 Apr. 7, 2005

(30) Foreign Application Priority Data

Aug. 22, 2002 (EP) ................................. 02255864

(51) Int. Cl.[7] ............................................ H01L 31/062
(52) U.S. Cl. ...................... 257/291; 257/290; 257/292; 438/60; 438/75; 438/199; 438/200
(58) Field of Search ............................... 257/290–292; 438/60, 75, 199, 200

(56) References Cited

U.S. PATENT DOCUMENTS

| | | | | |
|---|---|---|---|---|
| 5,461,425 A | 10/1995 | Fowler et al. | .............. | 348/294 |
| 5,801,657 A | 9/1998 | Fowler et al. | .............. | 341/155 |
| 6,271,785 B1 | 8/2001 | Martin et al. | ............... | 341/169 |
| 6,403,998 B1 * | 6/2002 | Inoue | ......................... | 257/292 |
| 6,448,104 B1 * | 9/2002 | Watanabe | .................... | 438/60 |
| 2002/0045306 A1 | 4/2002 | Watanabe | ................... | 438/224 |

FOREIGN PATENT DOCUMENTS

JP 1093358 4/1998 ............. G03F 3/08

OTHER PUBLICATIONS

Yang et al., A Nyquist-Rate Pixel-Level ADC for CMOS Image Sensors, IEEE Journal of Solid-State Circuits, IEEE Inc., New York, US, vol. 34, No. 3, Mar. 1999, pp. 348-356, XP000887499.

Bermak, A CMOS Imager with PFM/PWM Based Analog-to-Digital Converter, 2002 IEEE International Symposium on Circuits and Systems, Proceedings (Cat. No. 02CH37353), Phoenix-Scottsdale, AZ, May 26-29, 2002, pp. IV-53-6, vol. 4, XP002230579.

Kleinfelder et al., A 10000 Frame/s CMOS Digital Pixel Sensor, 2001 IEEE International Solid-State Circuits Conference, Digest of Technical Papers, San Francisco, CA, Feb. 5-7, 2001, vol. 36, No. 12, pp. 2049-2059, XP002230580.

* cited by examiner

*Primary Examiner*—Andy Huynh
(74) *Attorney, Agent, or Firm*—Lisa K. Jorgenson; Allen, Dyer, Doppelt, Milbrath & Gilchrist, P.A.

(57) ABSTRACT

An active pixel image sensor is formed on a P-type epitaxial layer on a P-type substrate. An active pixel array is in the P-type epitaxial layer. Each pixel includes an N-well functioning as a collection node, and a P-well adjacent the N-well. The P-well includes only NMOS transistors functioning as active elements. The in-pixel transistors cooperate with off-pixel PMOS transistors to form A-D converters.

35 Claims, 7 Drawing Sheets

SOLID STATE IMAGE SENSOR

FIELD OF THE INVENTION

The present invention relates to image sensors, and in particular, to solid state image sensors with active pixels.

BACKGROUND OF THE INVENTION

As is well known, in active pixel image sensors an area of the pixel acts as a photodiode, with photon-generated current being integrated on the self-capacitance of the photodiode. This charge is essentially an analog representation of light received at that pixel during the exposure period. When a digital signal is desired, it is necessary to provide A-D conversion.

Most active pixels use one or more A-D converters located off the image plane. This maximizes the light-converting properties of the image plane, but at the expense of requiring a relatively complex switching or multiplexing arrangement to transfer pixel signal values to the A-D converters.

Layouts have been proposed in which each pixel has its own A-D converter; see for example U.S. Pat. Nos. 5,461,425 and 5,801,657 to Fowler et al., U.S. Pat. No. 6,271,785 to Martin, and IEEE Journal Solid State Physics, December 2001, Vol. 36, No. 12, p. 2049 (Kleinfelder et al). However, these layouts have a disadvantage in that the additional circuitry in each pixel severely reduces the ability of the pixel to collect photon-generated electrons, and thus severely reduces sensitivity.

SUMMARY OF THE INVENTION

In view of the foregoing background, an object of the present invention is to provide a solid state image sensor in which the pixels therein have greater sensitivity than prior art image sensors.

This and other objects, advantages and features in accordance with the present invention are provided by a solid state image sensor comprising a substrate of a first conductivity type, and an epitaxial layer of the first conductivity type on the substrate. An active pixel array is in the epitaxial layer, and each pixel may comprise a first well of a second conductivity type functioning as a collection node, and at least one second well of the first conductivity type adjacent the first well. The at least one second well comprises a plurality of MOS transistors of only the second conductivity type functioning as active elements.

The first conductivity type may comprise a P-type conductivity and the second conductivity type may comprise an N-type conductivity. Alternatively, the first conductivity type may comprise an N-type conductivity, and the second conductivity type may comprise a P-type conductivity.

The solid state image sensor may further comprise circuit elements external the active pixel array. The active elements in each pixel and the external circuit elements may form part of an analog-to-digital converter. The solid state image sensor may further comprise at least one comparator external the active pixel array, and wherein the active elements in each pixel form an amplifier connected to the at least one comparator for forming part of the analog-to-digital converter. The active elements in each pixel may be selectively switched to the at least one comparator.

The circuit elements external each pixel may comprise at least one current mirror connected to the at least one comparator, and wherein the active elements in each pixel form a differential amplifier for receiving a pixel photodiode voltage and a reference voltage, and for providing a balanced output to the at least one current mirror connected thereto. A latch may be connected to the at least one comparator in which a count is latched by a change of state of the at least one comparator, and a frame store circuit may be connected to the latch for receiving the latched count.

The reference voltage may be ramped during a time when each pixel is integrating a photo induced current, and alternatively, the reference voltage may be ramped during reset of each pixel to provide an offset compensation.

Another aspect of the present invention is directed to a method for forming a solid state image sensor as described above.

BRIEF DESCRIPTION OF THE DRAWINGS

Embodiments of the invention will now be described, by way of examples only, with reference to the drawings, in which.

DETAILED DESCRIPTION OF THE PREFERRED EMBODIMENTS

Figure 1:
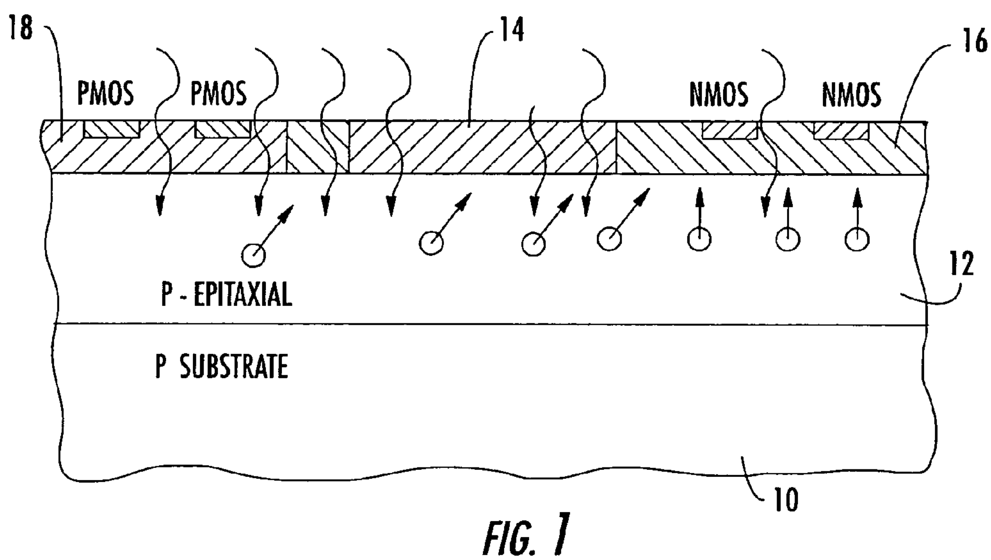
FIG. 1 illustrates a pixel in a prior art image sensor.

FIG. 1 shows a prior art approach to an image sensor having in-pixel circuitry such as an A-D converter. The sensor is formed on a P-type epitaxial layer 12 overlying a P-type substrate 10. The top part of the P-type epitaxial layer 12 is doped to provide the circuit components, namely an N-well 14 forming a collection node, NMOS transistors in a P-well 16, and PMOS transistors in an N-well 18.

For correct operation, the P-well 16 is biased to Vss (ground/0V), and the N-well is biased to Vdd, typically 3.3V or 1.8V. The collection node 14 is biased to a voltage between Vss and Vdd.

Light is absorbed by the silicon at a depth which is wavelength dependent. Typically, visible light generates a substantial number of electrons at a depth that is greater than the wells 14, 16 and 18. The collection node 14 as shown in FIG. 1 will collect electrons that are generated directly beneath it. The electrons which are generated close to the border of the collection node 14 and the P-well 16 are attracted to the positive potential of the collection node 14 and are collected. However, the electrons which are generated underneath or close to the N-well 18 are attracted to the positive bias of the N-well and are not collected. This corresponds to a loss of sensitivity of the pixel.

Figure 2:
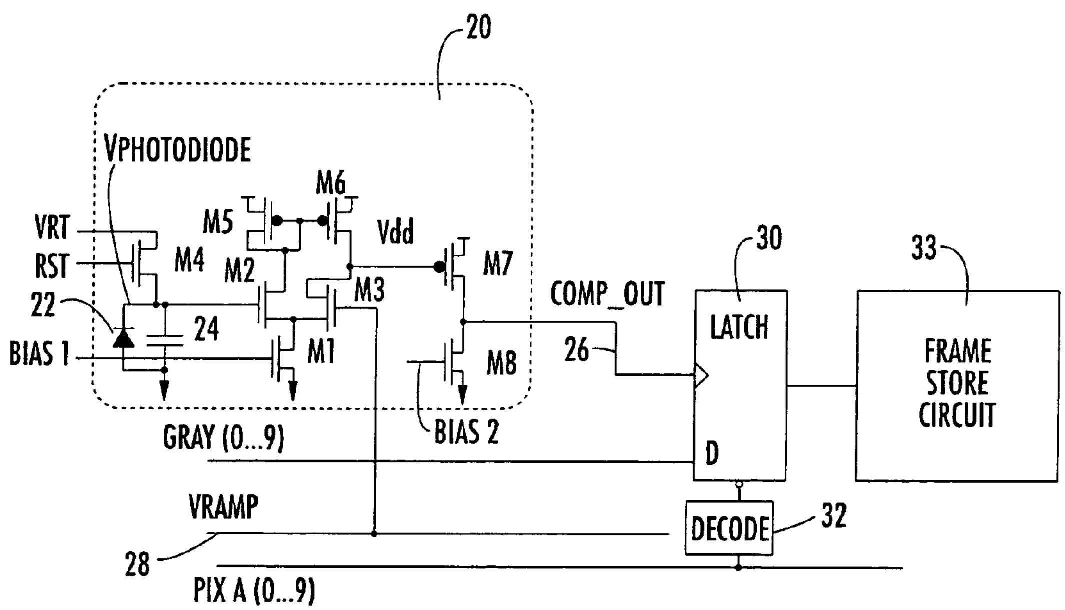
FIG. 2 is a circuit diagram showing one use of the pixel of FIG. 1.

FIG. 2 illustrates a circuit of the sensor of FIG. 1. One pixel 20 is shown, which includes the collection node 14 shown as the equivalent diode 22 and capacitance 24.

NMOS transistors M1–M4 control operation of the pixel, as will be described in more detail below. A comparator is formed by PMOS transistors M5–M7 and NMOS transistor M8, and provides an output on line 26 when the sampled pixel voltage equals a ramp voltage Vramp on line 28.

A number of schemes are possible for using the change of state of the comparator. In the example shown, the line 26 sets an N-bit latch 30 according to a 10-bit gray scale. The latch 30 could be inside or outside the pixel 20. The latch 30 for a given pixel is enabled at the appropriate time by a decode or select circuit 32. The latch 30 thus outputs a 10-bit representation of the pixel value, in this example to a frame store circuit 33.

Figure 3:
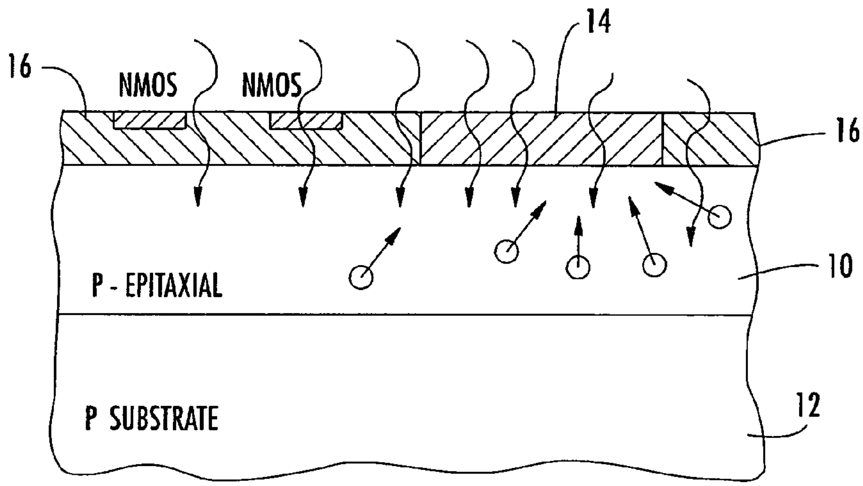
FIG. 3 illustrates a pixel in an image sensor according to one embodiment of the invention.

Turning to FIG. 3, the invention in this embodiment once again has a P-type epitaxial layer 10 over a P-type substrate 10. A collection node 14 is formed as an N-well. The surrounding surface is formed as a P-well 16 with amplification transistors provided by NMOS transistors only. The collection node 14 and P-well 16 may be contiguous, as shown, or may be separated by insulation or isolation material.

Thus, the sensor of FIG. 3 does not contain an N-well other than the N-well forming the collection node 14. Electrons generated in the epitaxial layer 10 are attracted to the most positive point in the pixel, which is now the collection node 14, thus increasing the sensitivity.

Figure 4:
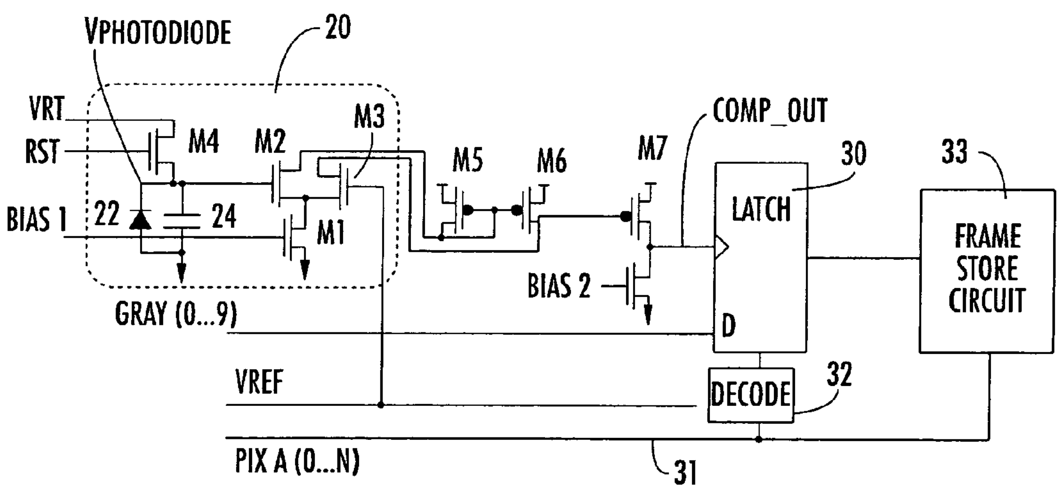
FIG. 4 is a circuit using the pixel of FIG. 3.

FIG. 4 shows one possible circuit making use of this embodiment. As discussed, the pixel 20 contains only NMOS transistors. Transistor M4 is used to reset the pixel voltage. Transistors M1–M3 form a long tail pair or differential amplifier, with M1 forming a current source to M2 and M3. The long tail pair is connected to a current mirror formed by PMOS transistors M5 and M6 located off or outside the pixel.

After reset, the voltage on the gate of M2 is higher than Vref (gate of M3). More current flows through M3 than M2 and hence more through M5 than M6. This keeps the gate of M7 high and the output Comp_out low.

After some time, dependent on the amount of light falling on the pixel, the voltage Vphotodiode will be lower than that on the gate of M3. When this happens, more current will flow through M3 than M2 and hence more through M6 than M5. This takes the gate of M7 low and the output Comp_out goes high.

The time that this transition takes place is stored using the N-bit latch 30 (in this example a 10-bit latch is used). In the arrangement of FIG. 4, there is an external current mirror and latch for each pixel. Typically, the output of the pixel latches are connected to a bus. An address bus 31 and a select circuit 32 are used to enable the bus output.

Figure 5:
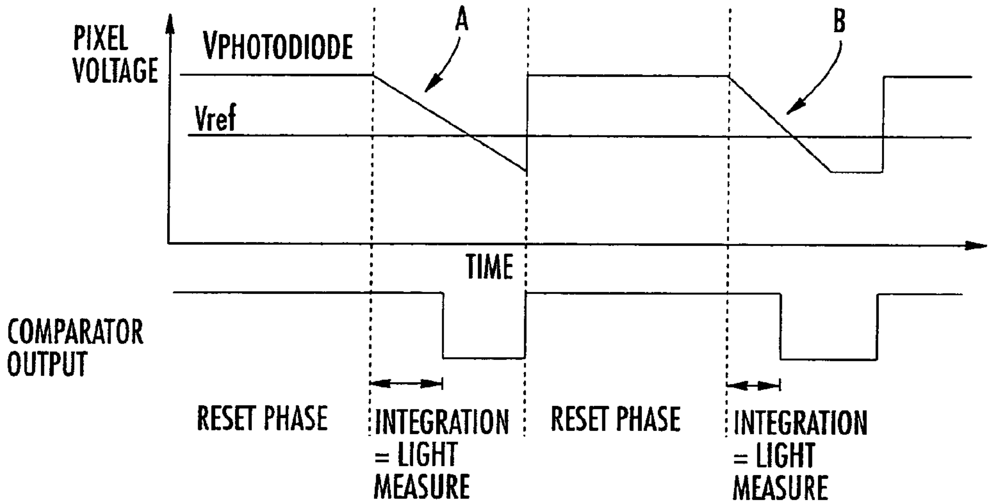
FIGS. 5 and 6 are timing diagrams illustrating operation of the circuit of FIG. 4.

FIG. 5 illustrates the timing for the circuit of FIG. 4. As will be seen at A and B, the greater the amount of light falling on the pixel, the steeper is the slope of the integrating waveform and the earlier the comparator changes state.

Figure 6:
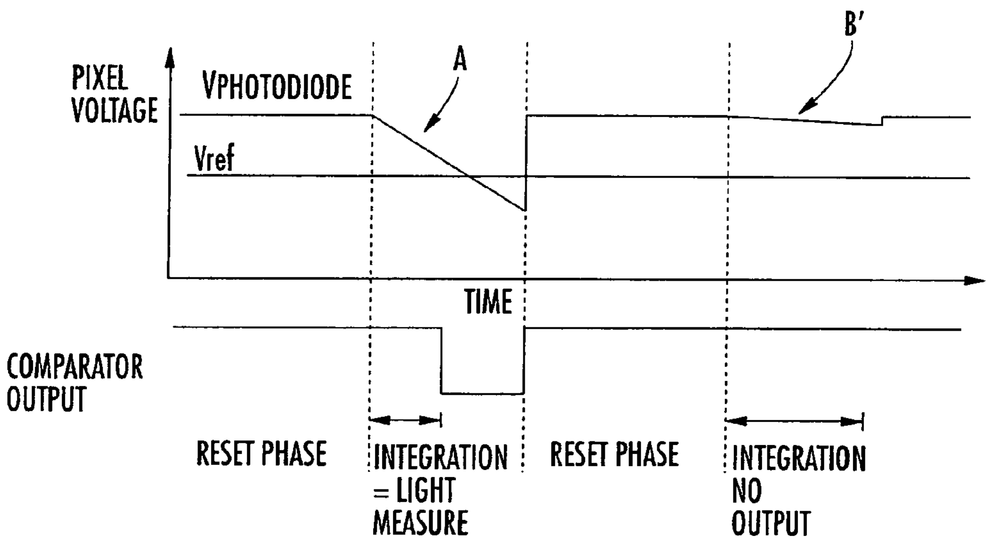
Figure 7:
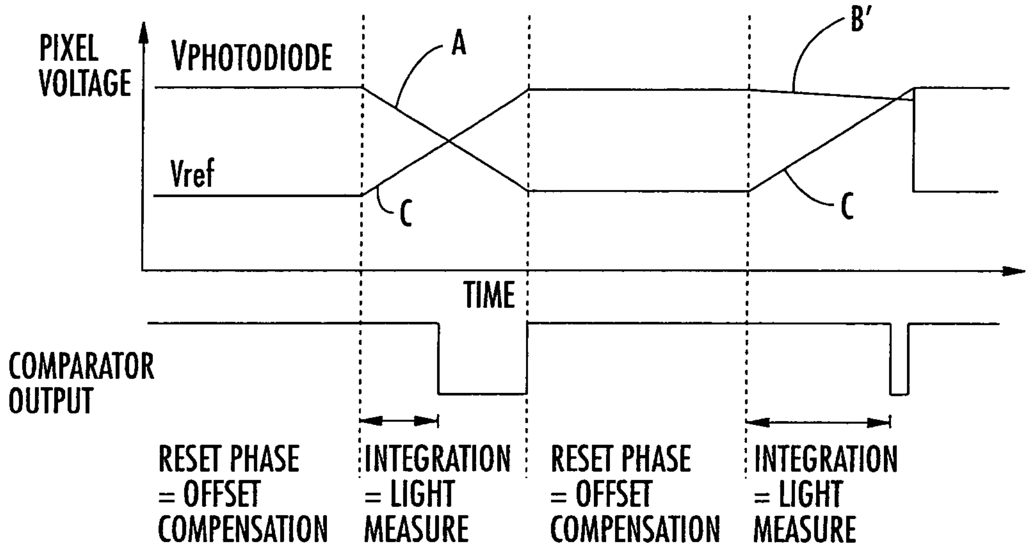
FIG. 7 is a timing diagram for a modified mode of operation of the invention.

This arrangement has the disadvantage that, as shown at B' in FIG. 6, low light levels produce a very shallow slope on Vphotodiode. This can be addressed either by lengthening the integration time which reduces the speed of the whole system, or by setting Vref very close to the maximum of Vphotodiode which makes the system very sensitive to noise. FIG. 7 overcomes these limitations by providing Vref in the form of more than one linear ramp C during integration.

Figure 8:
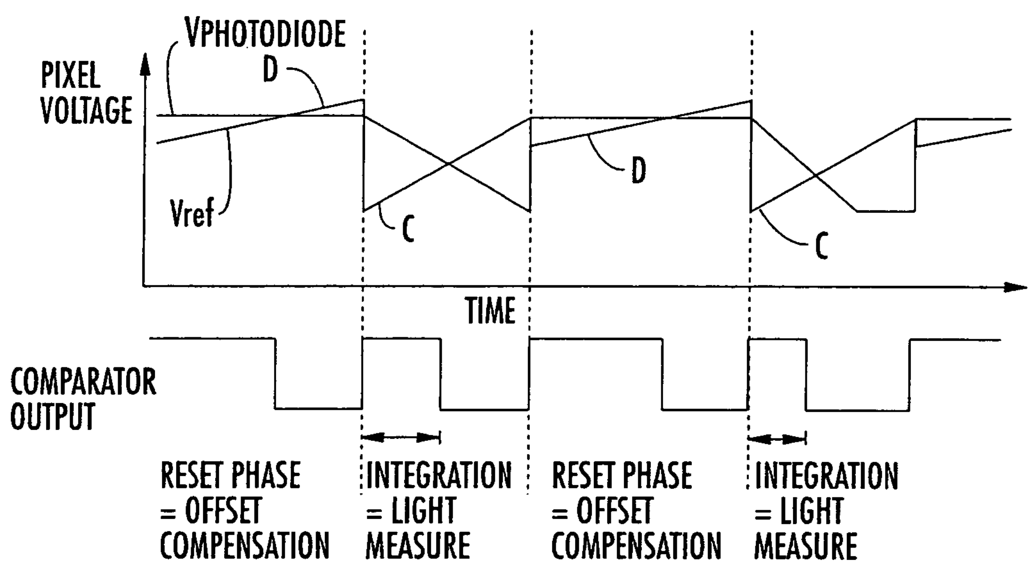
FIG. 8 is a timing diagram showing a further modified mode of operation of the invention.

FIG. 8 illustrates a further modification for use in reducing fixed pattern noise. With a careful layout, transistors M2 and M3 will match accurately. However, there is likely to be an offset when the outputs from the long tail pair and the current mirror change states. Moreover, because of manufacturing tolerances this offset is likely to vary between pixels, causing fixed pattern noise.

FIG. 8 shows an offset cancellation scheme. Reset transistor M4 is kept closed and the pixel is kept in reset. A ramp D is applied to Vref at the gate of M3. The system operates in a similar manner to the exposure of the pixels. When the comparator changes state the latch stores the count value on the Gray(0 . . . 9) bus. This count is stored in the frame store circuit 33 for subsequent subtraction from the output of the integration phase.

Figure 9:
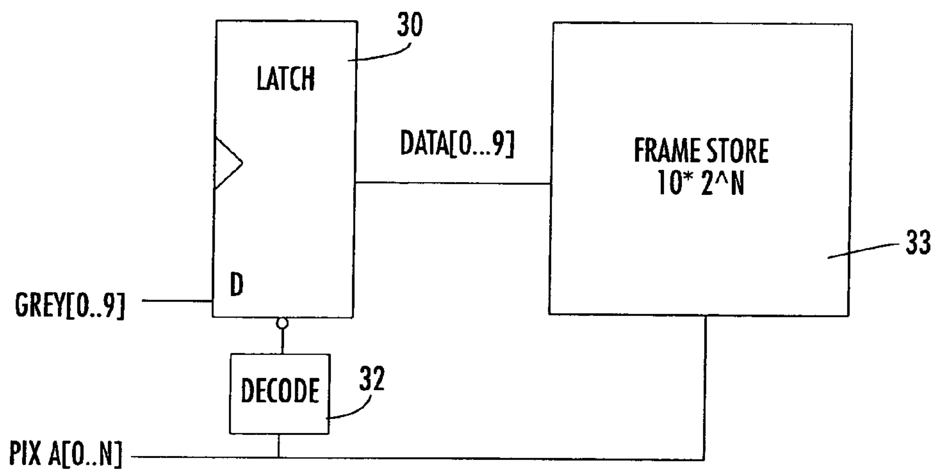
FIG. 9 shows part of the circuit of FIG. 4 in greater detail.
Figure 10:
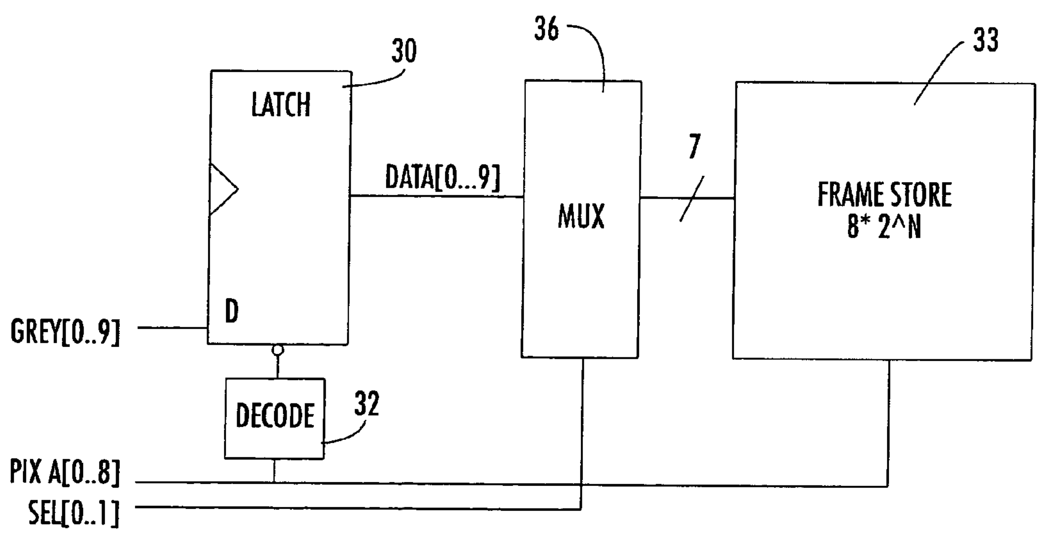
FIG. 10 shows an alternative circuit to the circuit of FIG. 9.

In a straightforward implementation, the width of the frame store function matches the width of the latches and the gray scale counter, i.e., 10 bits in the present example, as seen in FIG. 9. However, to save space in the IC it is possible to use a narrower width frame store function, and a selector circuit so that only the most relevant 8 bits, for example, are used. This is illustrated in FIG. 10 where a multiplexer 36 is used to select the 8 most significant bits if the signal is large, or the least significant 8 bits if the signal is small.

Figure 11:
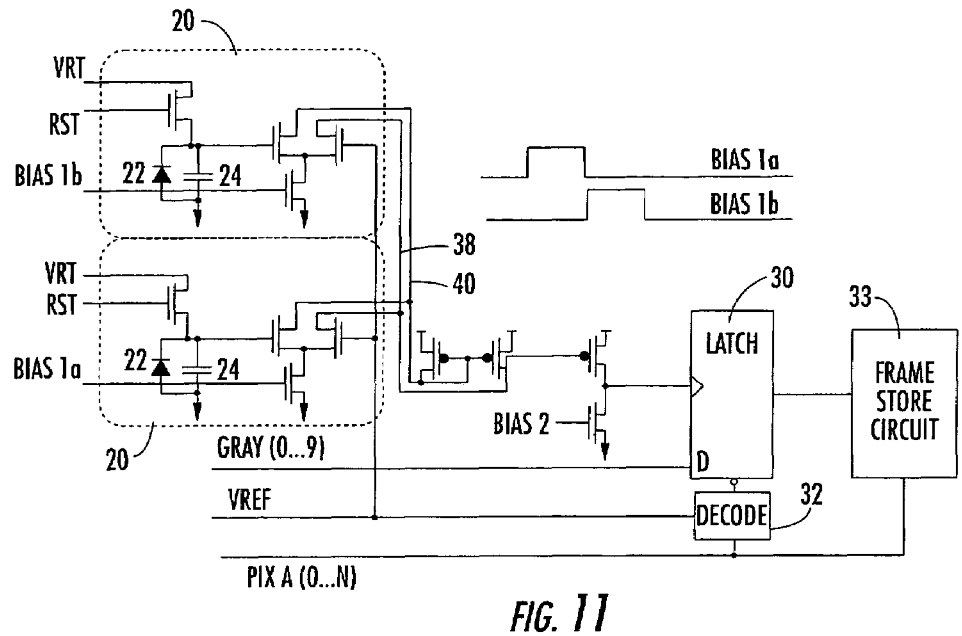
FIGS. 11, 12 and 13 respectively show modifications to the circuit of FIG. 4.

The foregoing description assumes that each pixel has its own current mirror and latch. This is feasible for small arrays, but for larger arrays it becomes necessary to share the current mirrors and latches between many pixels. In the system shown in FIG. 11, the Bias1*a*/Bias1*b* signal to the current load in the long tail pair is used to enable each of the rows in sequence. When Bias1*a*/Bias1*b* is low the pixel's readout is disabled, enabling the pixel to set to a suitable level. When Bias1*a*/Bias1*b* goes high the long tail pair is enabled and the difference between the photodiode voltage and Vref is output as a current difference on lines 38 and 40. The control signal for Bias1*a*/Bias1*b* is added to the address bus PixA(0 . . . 9) so that the output from the latch is written into the appropriate memory location.

Figure 12:
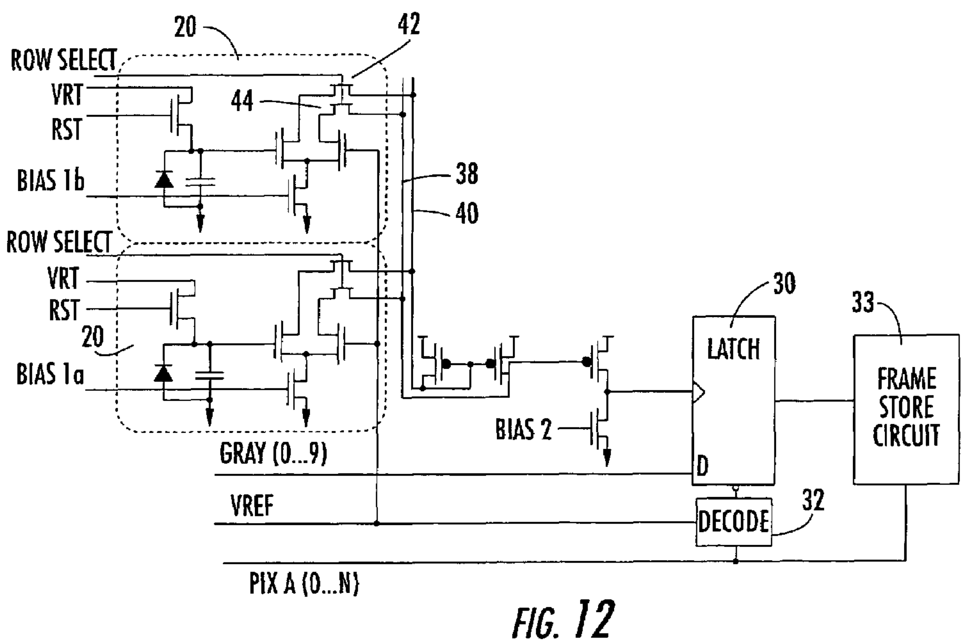
Figure 13:
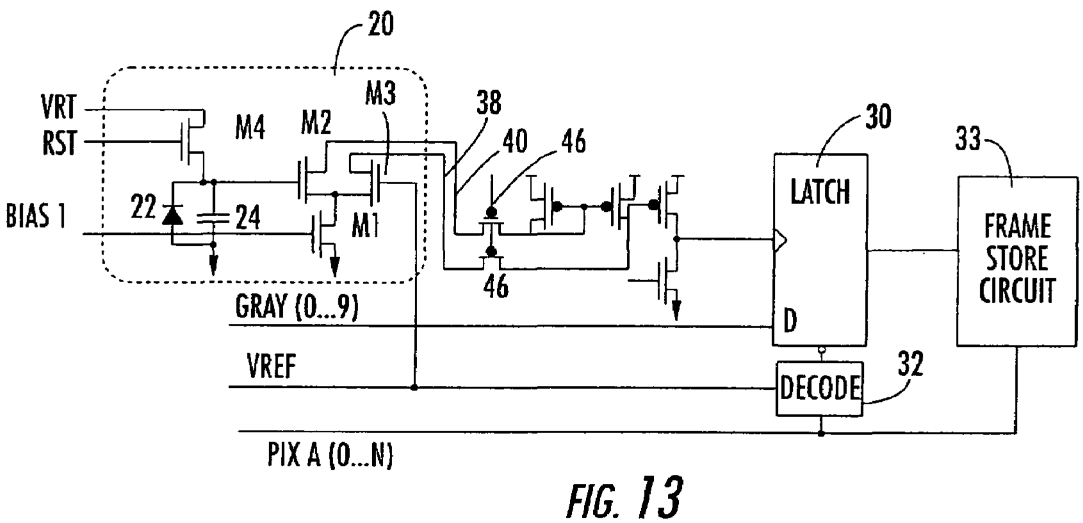

For larger arrays, the parasitic effect of the drains from all the pixels in the column will slow the access. To avoid this, as illustrated in FIG. 12, NMOS FETs 42 and 44 are inserted at each pixel into both legs of the long tailed pair and are used to multiplex the output onto the lines 38 and 40. Alternatively or additionally, cascode transistors 46 can be used (as seen in FIG. 13) to reduce the effects of stray capacitance on the lines 38 and 40 from the pixels.

The foregoing embodiments have been described in terms of a P-type substrate, with the collection node formed as an N-well and only NMOS transistors formed within the pixel. In principle, this could be inverted with an N-type substrate, wherein the collection node is a P-well and only PMOS transistors are within the pixel.

The invention provides image sensors in which the pixels have greater sensitivity than in the prior art. Also, the pixels have a balanced readout which provides greater noise immunity than in the older analog readout mechanisms. Greater sensitivity allows a sensor to operate at lower light levels, which is a significant requirement for cameras. Systems which incorporate their own light source require less power to illuminate the pixel, leading to reduced power consumption.

What is claimed is:

1. A solid state image sensor comprising:

a substrate of a first conductivity type;

an epitaxial layer of the first conductivity type on said substrate;

an active pixel array in said epitaxial layer, each pixel comprising a first well of a second conductivity type functioning as a collection node, at least one second well of the first conductivity type adjacent said first well, and a plurality of MOS transistors of only the second conductivity type functioning as active elements of said pixel; and circuit elements external said active pixel array, said external circuit elements comprising a respective comparator and counter for each pixel.

2. A solid state image sensor according to claim 1, wherein the first conductivity type comprises a P-type conductivity, and the second conductivity type comprises an N-type conductivity.

3. A solid state image sensor according to claim 1, wherein the first conductivity type comprises an N-type conductivity, and the second conductivity type comprises a P-type conductivity.

4. A solid state image sensor according to claim 1, and wherein said active elements in each pixel and said external circuit elements form part of an analog-to-digital converter.

5. A solid state image sensor according to claim 4, wherein said active elements in each pixel form an amplifier connected to said comparator for forming part of the analog-to-digital converter.

6. A solid state image sensor according to claim 5, wherein said active elements in each pixel are selectively switched to said comparator.

7. A solid state image sensor according to claim 5, wherein said circuit elements external each pixel comprise at least one current mirror connected to said comparator; and wherein said active elements in each pixel form a differential amplifier for receiving a pixel photodiode voltage and a reference voltage, and for providing a balanced output to said at least one current mirror connected thereto.

8. A solid state image sensor according to claim 7, wherein the reference voltage is ramped during a time when each pixel is integrating a photo induced current.

9. A solid state image sensor according to claim 7, wherein the reference voltage is ramped during reset of each pixel to provide an offset compensation.

10. A solid state image sensor according to claim 5, further comprising a latch connected to said at least one comparator in which a count is latched by a change of state of said at least one comparator.

11. A solid state image sensor according to claim 10, further comprising a frame store circuit connected to said latch for receiving the count latched by said latch.

12. A solid state image sensor comprising:

a substrate of a first conductivity type;

an epitaxial layer of the first conductivity type on said substrate;

an active pixel array in said epitaxial layer, each pixel comprising a first well of a second conductivity type functioning as a collection node, at least one second well of the first conductivity type adjacent said first well, and a plurality of MOS transistors of only the second conductivity type functioning as active elements of said pixel; and circuit elements external said active pixel array, said external circuit elements comprising comparators and counters, and wherein a number of pixels in a given row or column of said active pixel array share a single comparator and counter, with the corresponding pixels in the given row or column being enabled sequentially.

13. A solid state image sensor according to claim 12, wherein said active elements in each pixel form a differential amplifier, and outputs of said differential amplifier are multiplexed to a pair of output lines common to the corresponding pixels in the given row or column.

14. A solid state image sensor according to claim 13, wherein the active elements in each pixel further comprise cascode transistors connected to the outputs of each differential amplifier.

15. A solid state image sensor comprising:

a substrate;

an active pixel array in said substrate, each pixel comprising a first well of a first conductivity type functioning as a collection node, at least one second well of a second conductivity type adjacent said first well, and a plurality of MOS transistors of only the first conductivity type functioning as active elements; and circuit elements in said substrate and external said active pixel array and forming analog-to-digital converters with the active elements therein, the external circuit elements further comprising a respective comparator and counter for each pixel.

16. A solid state image sensor according to claim 15, wherein said substrate is of the second conductivity type; and wherein the first conductivity type comprises a P-type conductivity and the second conductivity type comprises an N-type conductivity.

17. A solid state image sensor according to claim 15, wherein said substrate is of the first conductivity type; and wherein the first conductivity type comprises a N-type conductivity and the second conductivity type comprises a P-type conductivity.

18. A solid state image sensor according to claim 15, wherein said active elements in each pixel form an amplifier connected to said comparator for forming an analog-to-digital converter.

19. A solid state image sensor according to claim 18, wherein said active elements in each pixel are selectively switched to said comparator.

20. A solid state image sensor according to claim 18, wherein said circuit elements external each pixel comprise at least one current mirror connected to said at least one comparator; and wherein said active elements in each pixel form a differential amplifier for receiving a pixel photodiode voltage and a reference voltage, and for providing a balanced output to said at least one current mirror connected thereto.

21. A solid state image sensor according to claim 20, wherein the reference voltage is ramped during a time when each pixel is integrating a photo induced current.

22. A solid state image sensor according to claim 20, wherein the reference voltage is ramped during reset of each pixel to provide an offset compensation.

23. A solid state image sensor according to claim 18, further comprising a latch connected to said comparator in which a count is latched by a change of state of said at least one comparator.

24. A solid state image sensor according to claim 23, further comprising a frame store circuit connected to said latch for receiving the count latched by said latch.

25. A solid state image sensor comprising:

a substrate;

an active pixel array in said substrate, each pixel comprising a first well of a first conductivity type functioning as a collection node, at least one second well of a second conductivity type adjacent said first well, and a plurality of MOS transistors of only the first conductivity type functioning as active elements; and circuit elements in said substrate and external said active pixel array and forming analogtodigital converters with the active elements therein;

wherein said circuit elements external each pixel further comprise comparators and counters for said active pixel array, and wherein a number of pixels in a given row or column of said active pixel array share a single comparator and counter, with the pixels being enabled sequentially.

26. A solid state image sensor according to claim 25, wherein said active elements in each pixel form a differential amplifier, and outputs of said differential amplifier are multiplexed to a pair of output lines common to the corresponding pixels in the given row or column.

27. A solid state image sensor according to claim 26, wherein the active elements in each pixel further comprise cascode transistors connected to the outputs of each differential amplifier.

28. A method for making a solid state image sensor comprising:

forming an active pixel array in a substrate, and forming each pixel comprising forming a first well of a first conductivity type functioning as a collection node, forming at least one second well of a second conductivity type adjacent the first well, forming a plurality of MOS transistors of only the first conductivl,ty type functioning as active elements; and forming circuit elements in the substrate external the active pixel array and forming analog-to-digital converters with the active elements therein;

wherein the circuit elements external each pixel further comprise a respective comparator and counter for each pixel.

29. A method according to claim 28, wherein the active elements in each pixel form an amplifier connected to the at least one comparator for forming an analog-to-digital converter.

30. A method according to claim 29, wherein the active elements in each pixel are selectively switched to the comparator.

31. A method according to claim 29, wherein the circuit elements external each pixel comprise at least one current mirror connected to the comparator; and wherein the active elements in each pixel form a differential amplifier for receiving a pixel photodiode voltage and a reference voltage, and for providing a balanced output to the at least one current mirror connected thereto.

32. A method according to claim 29, further comprising a latch connected to the comparator in which a count is latched by a change of state of the comparator.

33. A method according to claim 32, further comprising a frame store circuit connected to the latch for receiving the count latched by the latch.

34. A method for making a solid state image sensor comprising:

forming an active pixel array in a substrate, and forming each pixel comprising forming a first well of a first conductivity type functioning as a collection node, forming at least one second well of a second conductivity type adjacent the first well, forming a plurality of MOS transistors of only the first conductivity type functioning as active elements; and forming circuit elements in the substrate external the active pixel array and forming analog-to digital converters with the active elements therein, wherein the circuit elements external each pixel further comprise comparators and counters far the active pixel array, and wherein a number of pixels in a given row or column of the active pixel array share a single comparator and counter, with the pixels being enabled sequentially.

35. A method according to claim 34, wherein the active elements in each pixel form a differential amplifier, and outputs of the differential amplifier are multiplexed to a pair of output lines common to the corresponding pixels in the given row or coluxnn.

* * * * *

UNITED STATES PATENT AND TRADEMARK OFFICE

CERTIFICATE OF CORRECTION

PATENT NO. : 6,969,879 B2
DATED : November 29, 2005
INVENTOR(S) : Jeff Raynor

It is certified that error appears in the above-identified patent and that said Letters Patent is hereby corrected as shown below:

Column 7,
Line 6, delete “analogtodigital” insert -- analog-to-digital --.
Line 32, delete “conductivl,ty” insert -- conductivity --.

Column 8,
Line 33, delete “far” insert -- for --.

Signed and Sealed this

Thirteenth Day of June, 2006

JON W. DUDAS
*Director of the United States Patent and Trademark Office*